(12) United States Patent
Lim et al.

(10) Patent No.: US 7,160,741 B2
(45) Date of Patent: Jan. 9, 2007

(54) PLANAR VOLTAGE CONTRAST TEST STRUCTURE AND METHOD

(75) Inventors: Seng-Keong Victor Lim, Singapore (SG); Dennis Tan, Singapore (SG); Tze Ho Simon Chan, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 64 days.

(21) Appl. No.: 10/703,285

(22) Filed: Nov. 6, 2003

(65) Prior Publication Data

US 2005/0098780 A1    May 12, 2005

(51) Int. Cl.
    *H01L 21/00*    (2006.01)
(52) U.S. Cl. .......................... 438/14; 438/17; 438/19; 257/48
(58) Field of Classification Search ................ 438/14, 438/17, 19, 21; 257/48
    See application file for complete search history.

(56) References Cited

U.S. PATENT DOCUMENTS

| | | | | |
|---|---|---|---|---|
| 4,167,690 A | * | 9/1979 | Gange | 315/366 |
| 4,467,400 A | * | 8/1984 | Stopper | 361/767 |
| 4,479,088 A | * | 10/1984 | Stopper | 324/525 |
| 4,486,705 A | * | 12/1984 | Stopper | 324/73.1 |
| 5,315,130 A | * | 5/1994 | Hively et al. | 257/48 |
| 5,648,661 A | * | 7/1997 | Rostoker et al. | 257/48 |
| 6,285,040 B1 | * | 9/2001 | Sanada | 257/48 |
| 6,407,564 B1 | * | 6/2002 | Tseng | 324/755 |
| 6,995,393 B1 | * | 2/2006 | Weiner et al. | 257/48 |
| 7,105,917 B1 | * | 9/2006 | Cho et al. | 257/678 |
| 2003/0071261 A1 | * | 4/2003 | Weiner et al. | 257/48 |
| 2003/0071262 A1 | * | 4/2003 | Weiner et al. | 257/48 |
| 2005/0098780 A1 | * | 5/2005 | Lim et al. | 257/48 |
| 2006/0118784 A1 | * | 6/2006 | Lee et al. | 257/48 |

* cited by examiner

*Primary Examiner*—Laura M. Schillinger
(74) *Attorney, Agent, or Firm*—Mikio Ishimaru

(57) ABSTRACT

An integrated circuit and e-beam testing method are disclosed. The integrated circuit includes a test structure with a ground grid, a metal pad having a space therein and positioned within the ground grid, and a metal line connected to the ground grid and positioned in the space. Structures for detecting open circuits and short circuits are described.

10 Claims, 3 Drawing Sheets

PLANAR VOLTAGE CONTRAST TEST STRUCTURE AND METHOD

TECHNICAL FIELD

The present invention relates generally to semiconductor testing, and more particularly to test structures used in such testing.

BACKGROUND ART

In the semiconductor integrated circuit (IC) industry, there is a continuing demand for higher circuit packing densities. This demand of increased packing densities has led the semiconductor industry to develop new materials and processes to achieve sub-micron device dimensions. Manufacturing ICs at such minute dimensions adds more complexity to circuits and increases the demand for improved methods to inspect integrated circuits in various stages of their manufacture.

As design rules and process windows continue to shrink, IC manufacturers face many challenges in achieving and maintaining yields and profitability while moving to new process technologies such as larger wafers, copper interconnect, and low-k dielectrics. Additionally, defects that were not relevant in the older, larger design rules have now become problems as design rules are reduced to 0.13 µm geometries and below.

Although inspection of such products at various stages of manufacture is very important and can significantly improve production yield and product reliability, the increased complexity of ICs increases the cost of such inspections, both in terms of expense and time. However, if a defect can be detected early in production, the cause of the defect can be determined and corrected before a significant number of defective ICs are manufactured.

In order to overcome the problems posed by defective ICs, IC manufacturers fabricate test structures. Such test structures are used in defect analysis. The test structures are fabricated such that they are sensitive to defects that occur in IC products, but are designed so that the presence of defects is more readily ascertained. Such defect test structures often are constructed on the same semiconductor substrate as the IC products.

Defect detecting systems frequently utilize charged particle beams. In such systems, a charged particle beam, such as an electron beam, is irradiated on defect test structures. The interaction of the electron beam with features in the circuitry generates a number of signals in varying intensities, such as secondary electrons, back-scattered electrons, x-rays, etc. Typically, electron beam methods employ secondary electron signals for the well known "voltage contrast" technique for circuit defect detection.

The voltage contrast technique operates on the basis that differences in the various locations of a test structure under examination cause differences in secondary electron emission intensities. In one form of inspection, the mismatched portion between the defective voltage contrast image and the defect free one reveals the defect location. Thus, the potential state of the scanned area is acquired as a voltage contrast image such that a low potential portion of, for example, a wiring pattern might be displayed as bright (intensity of the secondary electron emission is high) and a high potential portion might be displayed as dark (lower intensity secondary electron emission). Alternatively, the system may be configured such that a low potential portion might be displayed as dark and a high potential portion might be displayed as bright.

A secondary electron detector is used to measure the intensity of the secondary electron emission that originates only at a path swept by a scanning electron beam. A defective portion can be identified from the potential state of the portion under inspection. Semiconductor wafers are tested during manufacturing to ensure quality control. One way wafers can be tested is using an electron beam (e-beam) inspection tool, which detects, by way of irradiating a wafer with an electron beam, surface defects as well as so-called "voltage contrast defects" that can be caused by defects in layers underlying the surface layer. Such voltage contrast occurs as a result of differential charge build-up on features, such as metal landing pads. When negative charges accumulate on a feature, the resulting negative potential repels electrons, causing the feature to appear bright under an electron microscope. In contrast, a positive charge build-up causes the feature to appear dark. In this way, an e-beam tool can be used to derive, from the contrast of the return image, whether a defect such as an electrical short or open exists in the wafer. Thus, in such systems, the voltage contrast is simultaneously monitored for both defective and defect free circuits for each IC manufactured.

Test structures usually are designed and manufactured to comply with the design rules used to manufacture the IC, therefore as the geometry sizes in ICs are reduced test structures become very small thereby reducing the contrast in the area of defects under the influence of e-beam testing equipment. Consequently, it becomes very difficult to perform a review of the defects detected and any associated failure analysis.

Existing test structure design uses a vertical structure approach in which the same test structure is repeated vertically in every metal layer of the IC. This test structure design is difficult to implement as ICs use more layers of metal interconnect in higher density ICs.

Existing test structures also are designed to test for only one defect type, such as an open circuit or a short circuit, resulting in limited capability.

Existing test structures additionally occupy a large amount of space on a wafer making it difficult to incorporate the test structures into the IC products. In addition, existing test structures tend to introduce electrical noise and interference into the ICs being manufactured.

Solutions to these problems long have been sought but prior developments have not taught or suggested any solutions and, thus, solutions to these problems have long eluded those skilled in the art.

DISCLOSURE OF THE INVENTION

The present invention provides a method of testing an integrated circuit using an e-beam tester comprising providing a ground grid. A metal pad having a space therein and positioned within the ground grid is provided. A metal line connected to the ground grid and positioned in the space is arranged to detect short circuits or open circuits when the integrated circuit is processed with the e-beam tester.

The metal line connected to the ground grid provides a metal line that is not electrically connected to the metal pad, whereby, upon the occurrence of an electrical short circuit between the metal line and the metal pad, the metal pad appears bright under the influence of the e-beam tester. The metal line connected to the ground grid provides a metal line that is electrically connected to the metal pad, whereby upon the occurrence of an electrical open circuit between the metal line and the metal pad, the metal pad appears dark under the influence of the e-beam tester. The metal line is at least one of a T-shaped line, an obtuse-angled line, a right-angled line, a straight line, a serpentine line, an interleaved comb, and combinations thereof.

The present invention provides test structures that are easier to review and analyze thereby increasing the ability to perform failure analysis.

The test structures of the present invention do not require vertical stacking in an IC, and additionally occupy a relatively small amount of space and therefore can be incorporated into available space in the IC products themselves.

The test structures of the present invention also are designed to test for both open circuits and short circuits, resulting in enhanced capability.

In addition, test structures manufactured in accordance with the present invention introduce less electrical noise and interference into the ICs being manufactured than existing test structures.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
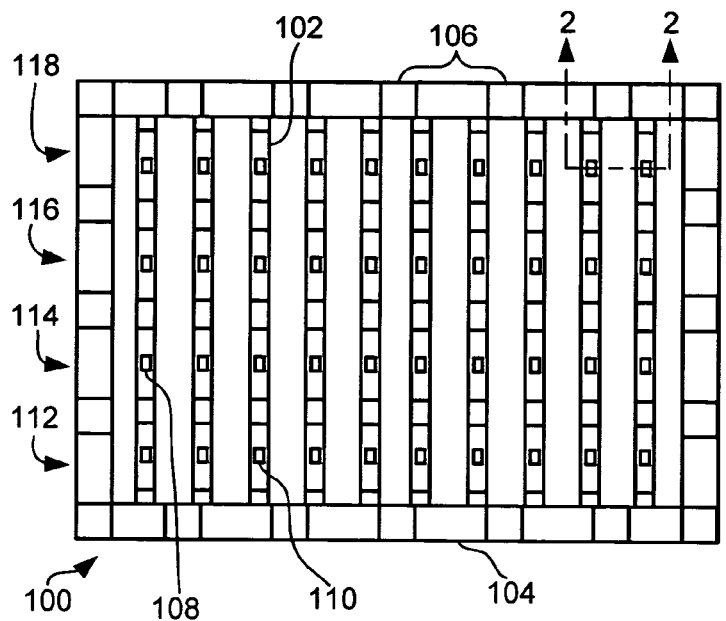
FIG. 1 is a partial plan view of a prior art layout of test structures viewed from beneath a first metal layer arranged for detecting an open circuit defect.

In the following description, numerous specific details are given to provide a thorough understanding of the invention. However, it will be apparent to one skilled in the art that the invention may be practiced without these specific details. In order to avoid obscuring the present invention, some well-known circuits, system configurations, and process steps are not disclosed in detail.

Likewise, the drawings showing embodiments of the apparatus are semi-diagrammatic and not to scale and, particularly, some of the dimensions are for the clarity of presentation and are shown greatly exaggerated in the FIGS. Similarly, although the sectional views in the drawings for ease of description, this arrangement in the FIGS. is arbitrary. Generally, the device can be operated in any orientation.

The term "horizontal" as used herein is defined as a plane parallel to the conventional plane or surface of the integrated circuit substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1 therein is shown a partial plan view from beneath a first metal layer 104 in an integrated circuit (IC) of a first layout 100 of a number of test structures 102 arranged for detecting an open circuit defect in accordance with the prior art. The first layout 100 includes the first metal layer 104, such as a ground plate. The first metal layer 104 has a number of metal contacts 106 positioned around the periphery of the first metal layer 104. The number of metal contacts 106 is manufactured in accordance with relaxed design rules, for example, if the design rules specify a nominal critical dimension (CD), such as 0.13 microns, then the relaxed dimension for the number of metal contacts 106 is relaxed to about 0.24 microns.

The first layout 100 also includes the number of test structures 102 positioned in the products (not shown) in the ICs under the first metal layer 104. The number of test structures 102 is positioned for detection of an open circuit defect. A first number of vias 108 is positioned in a second row 114 and a fourth row 118 of the first metal layer 104. A second number of vias 110 is positioned in the first row 112 and a third row 116 of the first metal layer 104.

The number of test structures 102 is formed during the manufacture of the IC, such as at the time the associated metal layer is formed. For example, when the first metal layer 104 is formed in the IC, the number of test structures 102 is formed in areas of the first layer of the IC that are unused for other purposes in the IC. As additional metal layers are formed in the IC, additional numbers of test structures are formed in the additional layers of the IC. Existing test structures often occupy a large amount of space making it impossible to incorporate the test structures into the actual manufactured product.

Figure 2:
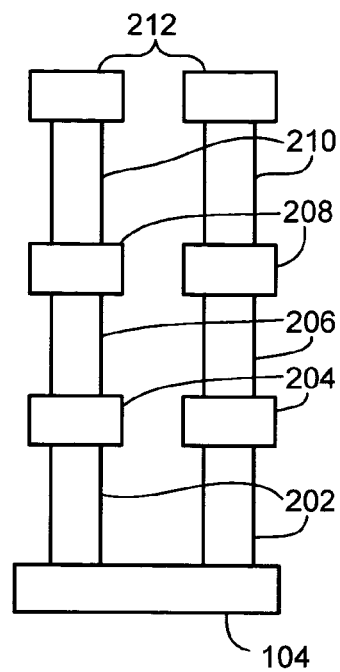
FIG. 2 is a cross-sectional view of FIG. 1 taken along line 2—2 of FIG. 1 showing the arrangement of the vias connecting additional metal layers.

Referring now to FIG. 2 therein is shown a cross-sectional view of FIG. 1 taken along line 2—2 of FIG. 1 showing the arrangement of the of vias. A first via 202 connects the first metal layer 104 to a second metal layer 204. A second via 206 connects the second metal layer 204 to a third metal layer 208. A third via 210 connects the third metal layer 208 to a fourth metal layer 212. The number of test structures 102 shown in FIG. 1 is positioned in unused areas of the circuitry between the various metal layers.

Each of the first number of vias 108 positioned beneath the second row 114 and the fourth row 118 of the first metal layer 104, as shown in FIG. 1, connect the first metal layer 104 to the fourth metal layer 212 through the first via 202, the second via 206, and the third via 210. The first via 202, the second via 206, and the third via 210 are in a stacked arrangement. Each of the second number of vias 110 positioned beneath the first row 112 and the third row 116 of the first metal layer 104, shown in FIG. 1, connect the second metal layer 204 to the third metal layer 208 through the second via 206. The third metal layer 208 is connected to the fourth metal layer 212 through the third via 210.

Figure 3:
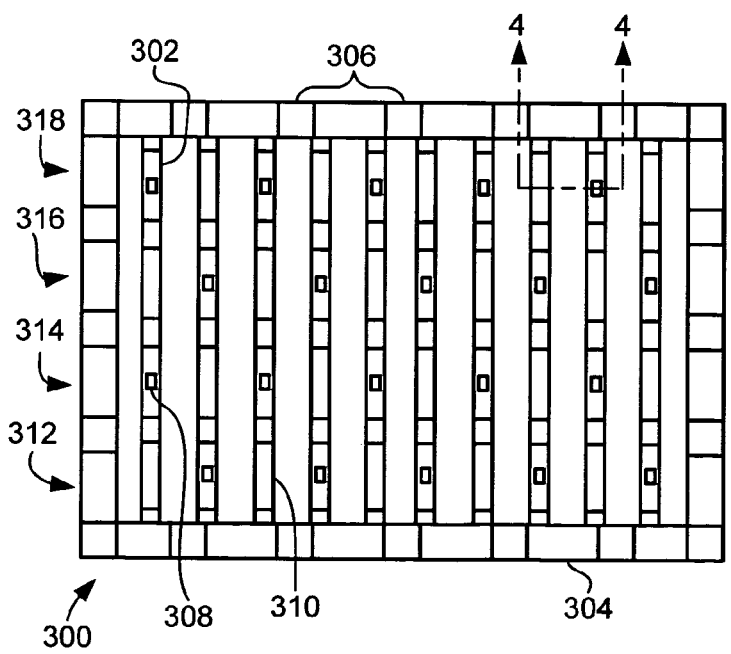
FIG. 3 is a partial plan view of a prior art layout of test structures viewed from beneath a first metal layer arranged for detecting a short circuit defect.

Referring now to FIG. 3 therein is shown a partial plan view from beneath a first metal layer 304 in an integrated circuit (IC) of a second layout 300 of a number of test structures 302 arranged for detecting an open circuit defect in accordance with the prior art. The second layout 300 includes the first metal layer 304, such as a ground plate. The first metal layer 304 has a number of metal contacts 306 around the periphery of the first metal layer 304. The number of metal contacts 306 is manufactured in accordance with relaxed design rules, for example, if the design rules specify a nominal CD, such as 0.13 microns, then the relaxed dimension for the number of metal contacts 306 is relaxed to about 0.24 microns.

The second layout 300 also includes the second number of test structures 302 positioned in the products (not shown) in the integrated circuits (ICs) under the first metal layer 404. The number of test structures 302 is positioned for detection of an open circuit defect. A first number of vias 308 is positioned in a second row 314 and a fourth row 318 of the first metal layer 304. A second number of vias 310 is positioned in the first row 312 and a third row 316 of the first metal layer 104. As is the case with respect to test structures arranged to detect short circuit defects, existing test structures often occupy a large amount of space making it impossible to incorporate the test structures into the actual manufactured product.

Figure 4:
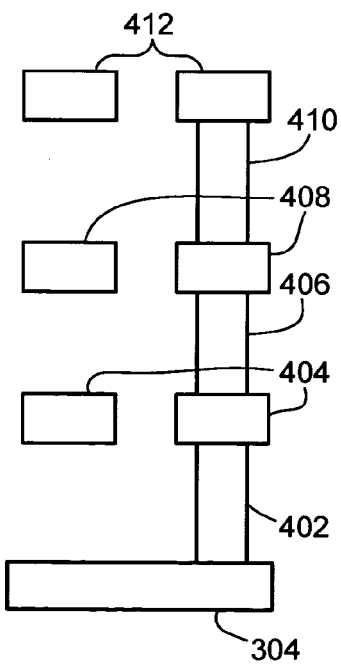
FIG. 4 is a cross-sectional view of FIG. 3 taken along line 4—4 of FIG. 3 showing the arrangement of the vias connecting additional metal layers.

Referring now to FIG. 4 therein is shown a cross-sectional view of FIG. 3 taken along line 4—4 of FIG. 3 showing the arrangement of the of vias. A first via 402 connects the first metal layer 304 to a second metal layer 404. A second via 406 connects the second metal layer 404 to a third metal layer 408. A third via 410 connects the third metal layer 408 to a fourth metal layer 412. The number of test structures 302 shown in FIG. 3 is positioned in unused areas of the circuitry between the various metal layers.

Each of the first number of vias 308 positioned beneath the second row 314 and the fourth row 318 of the first metal layer 304, as shown in FIG. 3, connect the first metal layer 304 to a fourth metal layer 412 through the first via 402, the second via 406 and the third via 410. The first via 402, the second via 406, and the third via 410 are in a stacked arrangement. Each of the second number of vias 310 positioned beneath the first row 312 and the third row 316 of the first metal layer 304, shown in FIG. 1, connect the second metal layer 404 to the third metal layer 408 through the second via 406. The second via is connected to the fourth metal layer 412 through the third via 410.

Figure 5:
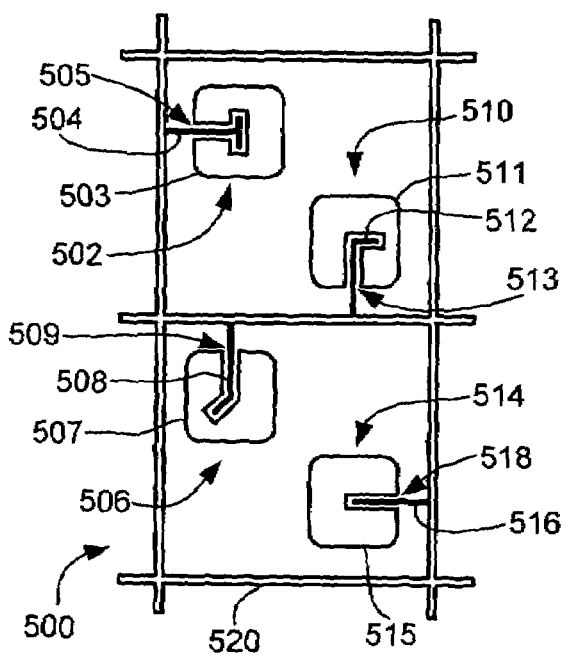
FIG. 5 is an enlarged plan view of a first number of test structures manufactured in accordance with the present invention for detecting a short circuit defect.

Referring now to FIG. 5 therein is shown an enlarged plan view of a first number of test structures 500 manufactured in accordance with the present invention for detecting a short circuit defect. The first number of test structures 500 includes a first test structure 502 comprising a first metal pad 503 and a first metal line 504 having a "T-shaped" configuration. The first metal line 504 is not connected to the first metal pad 502, and is spaced from the first metal pad 503 by a first space 505. The first number of test structures 500 is small enough to be positioned in a relatively small, unused portion of the IC thereby providing IC designers increased flexibility in the positioning of the first number of test structures 500 while reducing the amount of space on a wafer for positioning of the first number of test structures 500.

A second test structure 506 includes a second metal pad 507 and a second metal line 508 having an obtuse angled configuration. The second metal line 508 is not connected to the second metal pad 507, and is spaced from the second metal pad 507 by a second space 509.

A third test structure 510 includes a third metal pad 511 and a third metal line 512 having a right-angled configuration. The third metal line 512 is not connected to the third metal pad 511, and is spaced from the third metal pad 511 by a third space 513.

A fourth test structure 514 includes a fourth metal pad 515 and a fourth metal line 516 having a straight configuration. Again, the fourth metal line 516 is not connected to the fourth metal pad, and is spaced from the fourth metal pad by a fourth space 518.

The first number of test structures 500 has a ground grid 520 surrounding pairs of the first number of test structures 500. The ground grid 520 provides a connection to electrical ground for the first metal line 504, the second metal line 508, the third metal line 512, and the fourth metal line 516. The ground grid 520 also reduces the effect of any electrical noise or interference caused by the presence of the first number of test structures 500 in an IC. Preferably, the ground grid 520 is sized to be about three times the design rule for metal lines in a particular IC. The ground grid 520 is connected to an electrical ground in a particular IC through corner bond pads (not shown) attached to the corners of the ground grid 520.

Preferably, the first number of test structures 500 has metal lines and spaces sized relative to the design rules for the particular IC in which the first number of test structures 500 is being used. It has been discovered that the metal lines and spaces in the first number of test structures 500 should be sized in relation to the design rules for a particular IC. Preferably, the metal lines should be sized about twice the design rule for metal lines. Preferably, the spaces should be sized about equal to the design rule for spaces. It also has been discovered that the ground grid 520 should be about three times the design rule for metal lines.

For example, if the design rules for a particular IC specify that metal lines of 0.20 micron and spaces of 0.21 micron, the metal lines in the first number of test structures 500 preferably should be about 0.40 micron, the spaces should be about 0.21 micron, and the ground grid should be about 0.60 micron. The minimum pad size is in accordance with the design rules.

In operation, if a metal line of one of the first number of test structures 500 is touching its associated metal pad, there will be a short circuit between the metal line and its associated metal pad. The short circuit will cause the entire metal pad to appear bright when inspected by e-beam testing equipment as compared to any of the first number of test structures 500 in which the metal line is not in contact with its associated metal pad. The metal pad is larger than the size of the defect thereby making it easier to observe any defects that are detected under the influence of the e-beam testing equipment.

Figure 6:
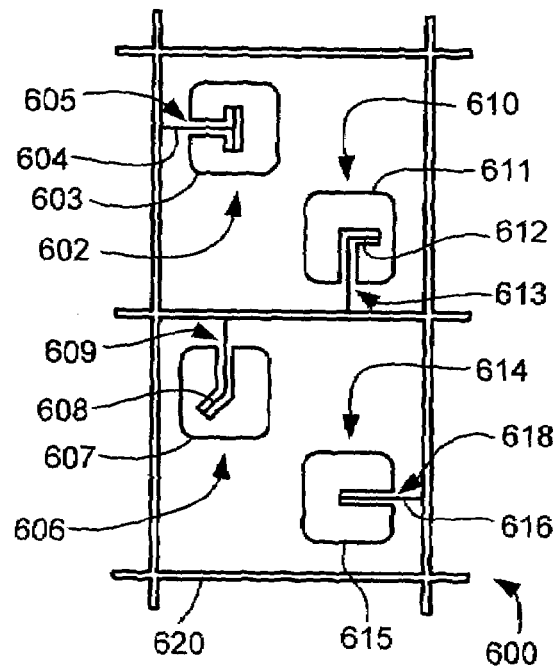
FIG. 6 is an enlarged plan view of a second number of test structures manufactured in accordance with the present invention for detecting an open circuit defect.

Referring now to FIG. 6 therein is shown an enlarged plan view of a second number of test structures 600 manufactured in accordance with the present invention for detecting an open circuit defect. The second number of test structures 600 includes a fifth test structure 602 comprising a fifth metal pad 603 and a fifth metal line 604 having a "T-shaped" configuration. The fifth metal line 604 is connected to the fifth metal pad 603, and is spaced from the fifth metal pad 603 by a fifth space 605. The second number of test structures 600 also is small enough to be positioned in a relatively small, unused portion of the IC thereby providing IC designers increased flexibility in the positioning of the second number of test structures 600 while reducing the amount of space on a wafer for positioning of the second number of test structures 600.

A sixth test structure 606 includes a sixth metal pad 607 and a sixth metal line 608 having an obtuse angled configuration. The sixth metal line 608 is connected to the sixth metal pad 607, and is spaced from the sixth metal pad 607 by a sixth space 609.

A seventh test structure 610 includes a seventh metal pad 611 and a seventh metal line 612 having a right-angled configuration. The seventh metal line 612 is connected to the seventh metal pad 611, and is spaced from the seventh metal pad 611 by a seventh space 613.

An eighth test structure 614 includes an eighth metal pad 615 and an eighth metal line 616 having a straight configuration. Again, the eighth metal line 616 is connected to the eighth metal pad 615, and is spaced from the eighth metal pad 615 by an eighth space 618.

The second number of test structures 600 has a ground grid 620 surrounding pairs of the second number of test structures 600. The ground grid 620 provides a connection to electrical ground for the fifth metal line 604, the sixth metal line 608, the seventh metal line 612, and the eighth metal line 616. The ground grid 620 also reduces the effect of any electrical noise or interference caused by the presence of the second number of test structures 600 in an IC. Preferably, the ground grid 620 is sized to be about three times the design rule for metal lines in a particular IC. The ground grid 620 is connected to an electrical ground in a particular IC through corner bond pads (not shown) attached to the corners of the ground grid 620.

Preferably, the second number of test structures 600 has metal lines and spaces sized relative to the design rules for the particular IC in which the second number of test structures 600 is being used. It has been discovered that the metal lines in the second number of test structures 600 should be about the same size as the design rule for metal lines, and that the spaces should be about twice the design rule for spaces in a particular IC. It also has been discovered that the ground grid 620 should be about three times the design rule for metal lines.

For example, if the design rules for a particular IC specify metal lines of 0.20 micron and spaces of 0.21 micron, the metal lines in the second number of test structures 600 preferably should be about 0.20 micron, the spaces should be about 0.42 micron, and the ground grid should be about 0.60 micron. The minimum pad size is in accordance with the design rules.

In operation, if a metal line of one of the second number of test structures 600 is broken, there will be an open circuit between the broken metal line and its associated metal pad. The open circuit will cause the entire metal pad to appear dark when inspected by e-beam testing equipment as compared to any of the second number of test structures 600 in which the metal line is not broken. The metal pad is larger than the size of the defect thereby making it easier to observe any defects that are detected under the influence of the e-beam testing equipment.

Figure 7:
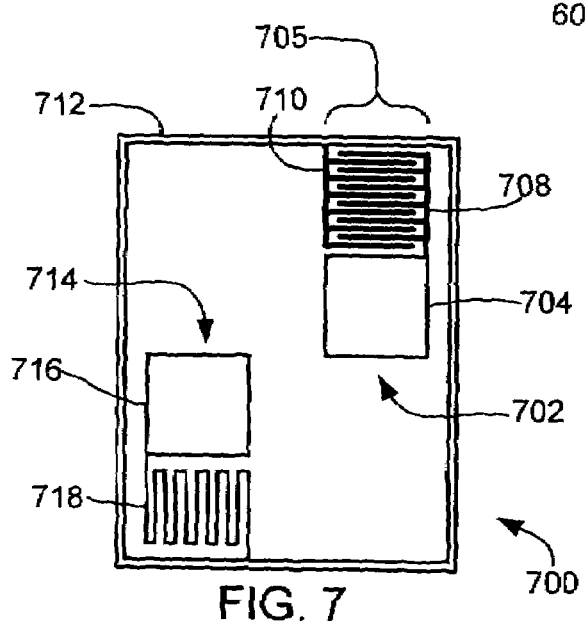
FIG. 7 is an enlarged plan view of alternate test structures manufactured in accordance with the present invention.

Referring now to FIG. 7 therein is shown an enlarged plan view of alternate test structures, referred to herein as a third number of test structures 700, and manufactured in accordance with the present invention. A ninth test structure 702 includes a ninth metal pad 704 and a metal comb structure 705. The metal comb structure 705 has a first portion 706 connected to the ninth metal pad 704 and a second portion 710 connected to a ground grid 712 that surrounds the third number of test structures 700. The first portion 706 and the second portion 710 of the metal comb structure 705 are interleaved and are not connected to each other. The ninth test structure 702 is designed to detect a short circuit.

Preferably, the ninth test structures 702 has metal lines and spaces sized relative to the design rules for the particular IC in which the ninth test structure 702 is being used. It has been discovered that the metal lines in the ninth test structure 702 should be about twice the design rule for metal lines, and that the spaces should be about the same as the design rule for spaces in a particular IC.

For example, if the design rules for a particular IC specify metal lines of 0.20 micron and spaces of 0.21 micron, the metal lines in the ninth test structure 702 preferably should be about 0.40 micron, the spaces should be about 0.21 micron, and the ground grid should be about 0.60 micron. The minimum pad size is in accordance with the design rules.

In operation, if part of the first portion 706 contacts part of the second portion 710 causing an electrical short, the entire ninth metal pad 704 will appear bright when inspected by e-beam testing equipment as compared to any of the ninth test structures 702 in which there is no short circuit.

A tenth test structure 714 includes a tenth metal pad 716 and a serpentine metal line 718 connected to the tenth metal pad 716 at one end. The other end of the serpentine metal line 718 is connected to the ground grid 712 that surrounds the third number of test structures 700. The tenth test structure 714 is designed to detect an open circuit.

Preferably, the tenth test structures 714 has metal lines and spaces sized relative to the design rules for the particular IC in which the ninth test structure 714 is being used. It has been discovered that the metal lines in the tenth test structure 714 should be about the same as the design rule for metal lines, and that the spaces should be about twice the design rule for spaces in a particular IC. The minimum pad size is in accordance with the design rules.

For example, if the design rules for a particular IC specify metal lines of 0.20 micron and spaces of 0.21 micron, the metal lines in the tenth test structure 714 preferably should be about 0.20 micron, the spaces should be about 0.42 micron, and the ground grid should be about 0.60 micron. The minimum pad size is in accordance with the design rules.

In operation, if the serpentine metal line 718 is broken causing an open circuit, the entire tenth metal pad 716 will appear dark when inspected by e-beam testing equipment as compared to any of the tenth test structures 714 in which there is no open circuit.

The foregoing description has described the existence of short circuit conditions resulting in the metal pad of the relevant test structure appearing bright, and the existence of open circuit conditions resulting in the in the metal pad of the relevant test structure appearing dark. It will be apparent to those skilled in the art that the bright and dark appearance can be changed and even reversed in some test equipment for these conditions. It also will be apparent to those skilled in the art that several of the test structures described herein can be positioned in combinations to detect both short circuit and open circuit defects in the same general area of an IC.

Figure 8:
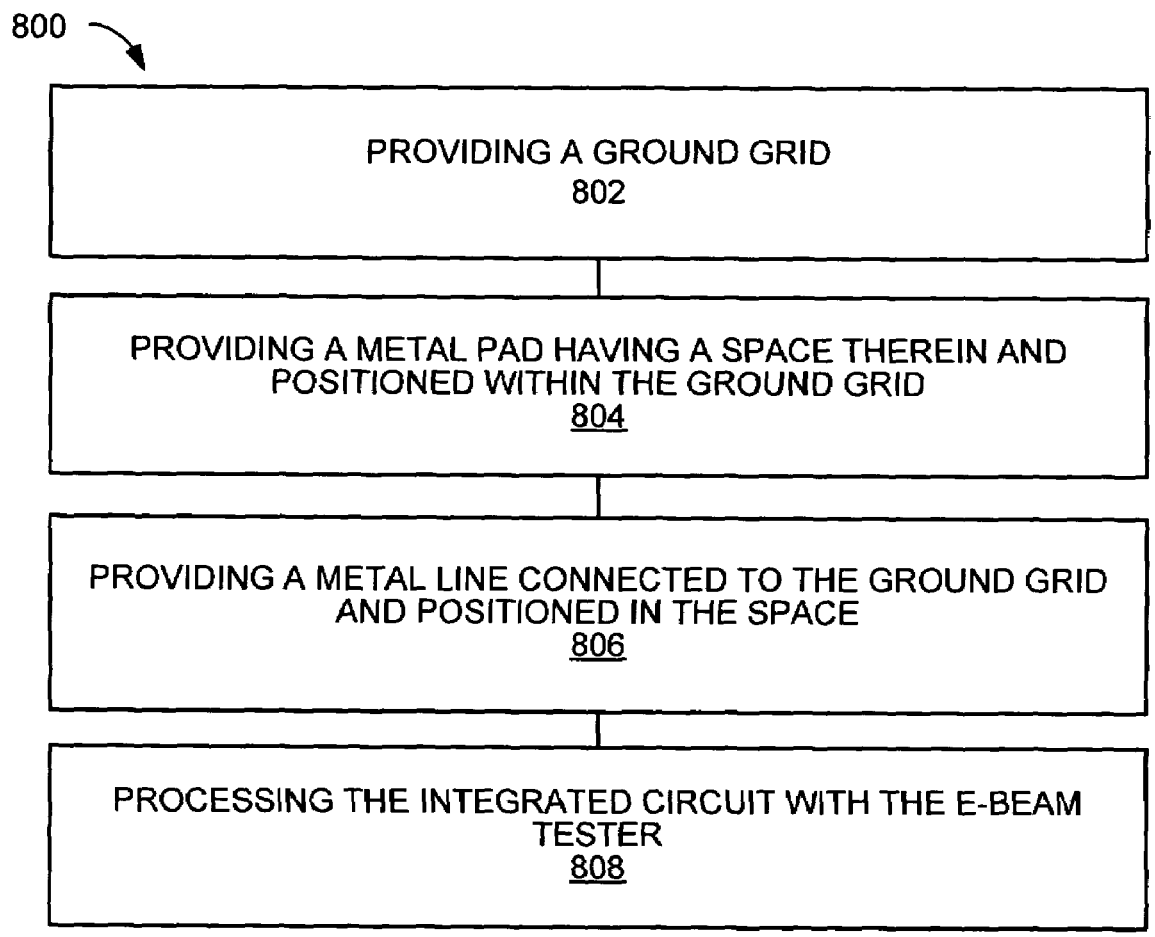
FIG. 8 is a flow chart of a method for testing an integrated circuit using an e-beam tester in accordance with the present invention.

Referring now to FIG. 8 therein is shown a flow chart of a method 800 of testing an integrated circuit using an e-beam tester. The method 800 includes a step 802 of providing a ground grid; a step 804 of providing a metal pad having a space therein and positioned within the ground grid; a step 806 of providing a metal line connected to the ground grid and positioned in the space; and a step 808 of processing the integrated circuit with the e-beam tester.

Thus, it has been discovered that the method and apparatus of the present invention furnish important and heretofore unavailable solutions, capabilities, and functional advantages for performing voltage contrast testing in integrated circuits. The resulting process and configurations are straightforward, economical, uncomplicated, highly versatile, and effective, use conventional technologies, and are thus readily suited for manufacturing integrated circuit devices that are fully compatible with conventional manufacturing processes and technologies.

The present invention provides test structures that are easier to review and analyze thereby increasing the ability to perform failure analysis of integrated circuits.

The test structures of the present invention do not require vertical stacking. Furthermore, they can be used in the IC product itself thereby reducing or eliminating the need to use valuable space on a wafer for the test structures.

The test structures of the present invention also are designed to test for both open circuits and short circuits, resulting in enhanced capability.

In addition, test structures manufactured in accordance with the present invention introduce less electrical noise and interference into the ICs being manufactured than existing test structures.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the spirit and scope of the included claims. All matters hitherto-fore set forth herein or shown in the accompanying drawings are to be interpreted in an illustrative and non-limiting sense.

The invention claimed is:

1. A method of testing an integrated circuit using an e-beam tester comprising:
   providing a ground grid on the integrated circuit to be tested;
   providing a metal pad having a space therein and positioned within the ground grid;
   providing a metal line connected to the ground grid and positioned in the space; and
   processing the integrated circuit with the e-beam tester.

2. The method of testing an integrated circuit using an e-beam tester as claimed in claim 1 wherein providing a metal line connected to the ground grid provides a metal tine that is not electrically connected to the metal pad, whereby, upon the occurrence of an electrical short circuit between the metal line and the metal pad, the metal pad appears bright under the influence of the e-beam tester.

3. The method of testing an integrated circuit using an e-beam tester as claimed in claim 1 wherein providing a metal line connected to the ground grid provides a metal line that is electrically connected to the metal pad, whereby upon the occurrence of an electrical open circuit between the metal line and the metal pad, the metal pad appears dark under the influence of the e-beam tester.

4. The method of testing an integrated circuit using an e-beam tester as claimed in claim 1 wherein providing a metal line provides a metal line of at least one of a T-shaped line, an obtuse-angled line, a right-angled line, a straight line, a serpentine line, an interleaved comb, and combinations thereof.

5. The method of testing an integrated circuit using an e-beam tester as claimed in claim 1 further comprising;
   providing a second metal pad having a space therein positioned within the ground grid; and
   providing a second metal line within the ground grid, wherein the second metal line is connected to the ground grid and spaced from the second metal pad.

6. A method of testing an integrated circuit using an e-beam tester comprising:
   providing a ground grid;
   providing a plurality of metal pads each having a space therein and positioned within the ground grid;
   providing a plurality of metal lines within the ground grid, wherein each of the plurality of metal lines is connected to the ground grid, associated with one of the plurality of metal pads, and positioned within the space of its associated one of the plurality of metal pads; and
   processing the integrated circuit with the e-beam tester.

7. The method of testing an integrated circuit using an e-beam tester as claimed in claim 6 wherein providing a plurality of metal lines within the ground grid provides at least a portion of the plurality of metal lines that is not electrically connected to an associated metal pad, whereby, upon the occurrence of an electrical short circuit between a portion of the metal lines and the associated metal pad, the associated metal pad appears bright under the influence of the e-beam tester.

8. The method of testing an integrated circuit using an e-beam tester as claimed in claim 6 wherein providing a plurality of metal lines within the ground grid provides at least a portion of the plurality of metal lines that is electrically connected to an associated metal pad, whereby upon the occurrence of an electrical open circuit between a portion of the metal lines and the associated metal pad, the associated metal pad appears dark under the influence of the e-beam tester.

9. The method of testing an integrated circuit using an e-beam tester as claimed in claim 6 wherein providing a plurality of metal lines provides a plurality of metal lines of at least one of a T-shaped line, an obtuse-angled line, a right-angled line, a straight line, a serpentine line, an interleaved comb, and combinations thereof.

10. The method of testing an integrated circuit using an e-beam tester as claimed in claim 6 wherein at least a first portion of the plurality of metal lines is not electrically connected to their associated metal pads; and at least a second portion of the plurality of metal lines is electrically connected to their associated metal pads.

* * * * *

UNITED STATES PATENT AND TRADEMARK OFFICE
CERTIFICATE OF CORRECTION

| | | |
|---|---|---|
| PATENT NO. | : 7,160,741 B2 | Page 1 of 1 |
| APPLICATION NO. | : 10/703285 | |
| DATED | : January 9, 2007 | |
| INVENTOR(S) | : Lim et al. | |

It is certified that error appears in the above-identified patent and that said Letters Patent is hereby corrected as shown below:

Column 9, line 47, delete "tine" and insert therefor --line--

Signed and Sealed this

Thirteenth Day of February, 2007

JON W. DUDAS
*Director of the United States Patent and Trademark Office*